(12) United States Patent
Beaulaton et al.

(10) Patent No.: US 8,912,857 B2
(45) Date of Patent: Dec. 16, 2014

(54) PLL SYSTEM AND METHOD FOR CONTROLLING A GAIN OF A VCO CIRCUIT

(75) Inventors: Hugues Beaulaton, Toulouse (FR); Thierry Cassagnes, Tournefeuille (FR); Stéphane Colomines, Toulouse (FR); Didier Salle, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 886 days.

(21) Appl. No.: 12/936,214

(22) PCT Filed: Apr. 18, 2008

(86) PCT No.: PCT/IB2008/053136
§ 371 (c)(1),
(2), (4) Date: Oct. 4, 2010

(87) PCT Pub. No.: WO2009/127915
PCT Pub. Date: Oct. 22, 2009

(65) Prior Publication Data
US 2013/0187719 A1    Jul. 25, 2013

(51) Int. Cl.
*H03B 5/12* (2006.01)
*H03L 7/16* (2006.01)
*H03L 7/099* (2006.01)
*H03L 7/113* (2006.01)
*H03L 7/18* (2006.01)

(52) U.S. Cl.
CPC ... *H03L 7/16* (2013.01); *H03L 7/18* (2013.01); *H03B 5/1228* (2013.01); *H03B 2201/0208* (2013.01); *H03L 7/099* (2013.01); *H03L 7/113* (2013.01)

USPC .... 331/177 V; 331/16; 331/167; 331/117 FE; 331/117 R; 331/34; 331/179

(58) Field of Classification Search
CPC ............... H03B 2201/0208; H03B 5/1228
USPC .............. 331/177 V, 16, 34, 167, 179, 117 R, 331/117 FE
See application file for complete search history.

(56) References Cited

U.S. PATENT DOCUMENTS

| | | |
|---|---|---|
| 5,382,922 A | 1/1995 | Gersbach et al. |
| 6,566,966 B1 | 5/2003 | Bellaouar et al. |
| 6,597,249 B2 | 7/2003 | Chien et al. |
| 2002/0075080 A1 | 6/2002 | Nelson et al. |
| 2003/0119467 A1 | 6/2003 | Welland et al. |
| 2003/0197564 A1 | 10/2003 | Humphreys et al. |
| 2006/0145767 A1 | 7/2006 | Vaananen |
| 2006/0226916 A1 | 10/2006 | Florescu et al. |
| 2007/0188255 A1 | 8/2007 | Strandberg |

OTHER PUBLICATIONS

International Search Report and Written Opinion correlating to PCT/IB2008/053136 dated Jan. 7, 2009.

*Primary Examiner* — Arnold Kinkead

(57) ABSTRACT

A phase locked loop system, comprises: a voltage controlled oscillator circuit, comprising a first plurality of switchable varactors for selecting a frequency band of the VCO, that has a gain that changes with frequency band, and a second plurality of switchable varactors for varying the gain in the selected band. The PLL system has a PLL feedback circuit comprising a switching device for switching the feedback circuit to an open loop state wherein a plurality of predefined tuning voltages can be applied to the VCO; a frequency measurement device for measuring the synthesized VCO frequency; and a control unit operable to determine the gain with respect to the synthesized frequency and the tuning voltages.

23 Claims, 6 Drawing Sheets

PLL SYSTEM AND METHOD FOR CONTROLLING A GAIN OF A VCO CIRCUIT

FIELD OF THE INVENTION

This invention in general relates to analog and digital electronic devices, and more specifically to a phase locked loop (PLL) system and a method for controlling a gain of a voltage controlled oscillator (VCO) circuit in a PLL system.

BACKGROUND OF THE INVENTION

Radio frequency systems often require synthesizing a wide range of frequencies, which is normally achieved by a phase locked loop (PLL). The PLL has the advantage of providing the local oscillator frequency required by the radio with an improved phase noise and over a wide frequency band.

A PLL basically outputs a synthesized frequency, i.e. a local oscillator frequency generated by a voltage controlled oscillator (VCO) having its controlling (or tuning) voltage ($V_{tune}$) driven by a feedback loop. A phase detector fed by a reference frequency $f_{ref}$ and by a variable feedback frequency $f_v$ being the synthesized frequency $f_{out}$ divided by a programmable divider (1/N) provides the phase difference of those two inputs to a loop filter. This is a low pass filter that averages the phase error between $f_{ref}$ and $f_v$ and provides the $V_{tune}$ tuning voltage driving the VCO. Once the PLL is locked, the following equation arises: $f_{out}=N \cdot f_{ref}$.

Two PLL architectures are most commonly used. The first architecture uses a phase-frequency detector by means of a charge pump. This circuit provides current pulses proportional to the phase error. Then the current pulses are converted to smooth control voltage by means of a low pass filter. This architecture provides the design advantage of having a closed loop frequency response easily controlled by setting the correct charge pump gain and by setting the correct loop filter component values. It is therefore easy to design a stable charge pump PLL only by tuning the loop filter or charge pump gain. Unfortunately, the charge pump architecture suffers from non-linearities caused by the non-ability of providing zero current pulses. Moreover, the main weakness of the charge pump architecture is the non-integration of the loop filter. The filter capacitance being very large, current technologies are unable to integrate these components into silicon IC. They are therefore implemented at module or printed-circuit-board level.

In order to improve the radio integration, a second architecture can be chosen, by implementing, for example, a XOR phase detector instead of an arrangement with charge pump. This architecture implies less design workload than the charge pump PLL since the phase detector is a simple XOR gate. Furthermore, the required low pass loop filter capacitors can be about a thousand times smaller than for the charge pump PLL. Therefore, these capacitors can be easily integrated.

The loop gain of an XOR PLL is equal to $K_p \cdot KV_{CO}/N$, where $K_p$ and $KV_{CO}$ are the phase detector gain and the VCO gain, respectively. A gain, as used in this document, is the ratio of a change of an output value divided by the corresponding change of an input value. $K_p$ is a fixed number equal to $V_{CC}/\pi$, where $V_{CC}$ is the supply voltage of the XOR phase detector. For a given low pass filter cut-off frequency, $KV_{CO}$ is then the main degree of freedom to be used to control both the bandwidth and the phase margin, i.e. the difference between the phase angle of the output signal and $-2\pi$ and therefore an indication of relative stability of the PLL loop. The PLL bandwidth is an important parameter of a PLL: The lower the bandwidth, the better jitter, or phase noise in the frequency domain, of the input signal is filtered. Therefore, the target VCO gain value $KV_{CC}$ is usually fairly low. A wide VCO frequency range is achieved by splitting up the frequency range into a large number of frequency bands (sub-bands) that can be implemented by adding additional capacitance to the oscillator core of a VCO.

However, the VCO gain changes according to the synthesized frequency. Current technologies do not provide the ability of designing constant VCO gain over a wide frequency range. These gain variations affect the PLL frequency response, and compensating them through the loop filter component values would actually not allow to reach the same PLL bandwidth and phase margin conditions.

As an example, the PLL closed loop transfer function can imply to have a VCO gain in the range of tens of MHz: Synthesizing 1 GHz with a VCO gain of 50 MHz/V implies a VCO tuning voltage range of 20 V. Integrated radio requires such frequencies, but does not provide such high voltages. The VCO frequency range is therefore split into multiple frequency bands by adding sets of additional capacitors to the oscillator core. This is achieved by using varactors, i.e. diodes whose capacitance varies with the applied voltage. In this example, the number of frequency bands can be 100 in order to provide a $V_{tune}$ voltage range of 200 mV.

The frequency synthesized by a VCO having an impedance L and a capacitance C is given by $$\omega = \frac{1}{\sqrt{L \cdot C}}, \quad \text{(eq. 1)}$$

where $C=C_D+C_A+C_F$, where $C_D$ is the capacitance due to digitally controlled varactors, $C_A$ is the capacitance due to analog controlled varactors and $C_F$ is the fixed capacitance due to layout and all the devices present. A digitally controlled varactor receives ground or supply voltage at a varactor controlling node, whereas an analog controlled varactor receives a voltage that varies with the tuning voltage.

To maximize the frequency tuning range, often desired in an application, $C_D+C_A$ must be as large as possible compared to $C_F$.

To achieve this, the number of varactors must be large and must be split into a large number of digitally controlled varactor banks (named sub-bands or frequency bands). Controlling a varactor in a digital way, i.e. applying ground or supply voltage, is the way that gives the maximum ratio of maximum to minimum capacitance. But it is impossible to design all frequency bands with the same gain. The higher the synthesized frequency, the more increases the gain. Thus, a described PLL does not have the same behaviour when synthesizing a low or a high frequency. This is due to the definition of the VCO gain:

$$K_{VCO} = \frac{d\omega}{dV_{tune}} = -\frac{\omega^3 L}{2} \frac{dC}{dV_{tune}} \quad \text{(eq. 2)}$$

$$\rightarrow K_{VCO} = \frac{d\omega}{dV_{tune}} = -\frac{\omega^3 L}{2} \frac{dC_A(V_{tune})}{dV_{tune}} \quad \text{(eq. 3)}$$

The impedance L and $$\frac{dC_A}{dV_{tune}}$$

are constants in a given design, so it is clear from eq. 3 that the VCO gain increases with increasing synthesized frequency $\omega = 2\pi \cdot f_{out}$ as the cube of the frequency. These gain variations affect the PLL frequency response, compromising stability and phase noise. Since the PLL phase noise cannot be accurately quantified, tighter phase margins cannot be achieved. Furthermore, the gain variations prevent the transient response of the PLL from being precisely predictable. Therefore, the margin for the PLL settling time and the standard deviation of the synthesizer performance cannot be lowered and therefore do not allow a better production yield and a tighter margin for a receiver line-up noise budget. Therefore, the effects of a fab change cannot be mitigated.

Use of gain variation techniques in a VCO is known in the prior art. Those techniques use a selection of the gain for each frequency band or group of frequency bands from a lookup table (LUT), thus not compensating for process and temperature variations. The VCO gain variation is not controlled and implies to design with larger phase margin and with variable PLL frequency response. This is not a robust method, a lab characterization is needed to fill up the LUT, and it does not inherently compensate for process and temperature variations.

SUMMARY OF THE INVENTION

The present invention provides a phase locked loop (PLL) system and a method for controlling a voltage controlled oscillator (VCO) circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
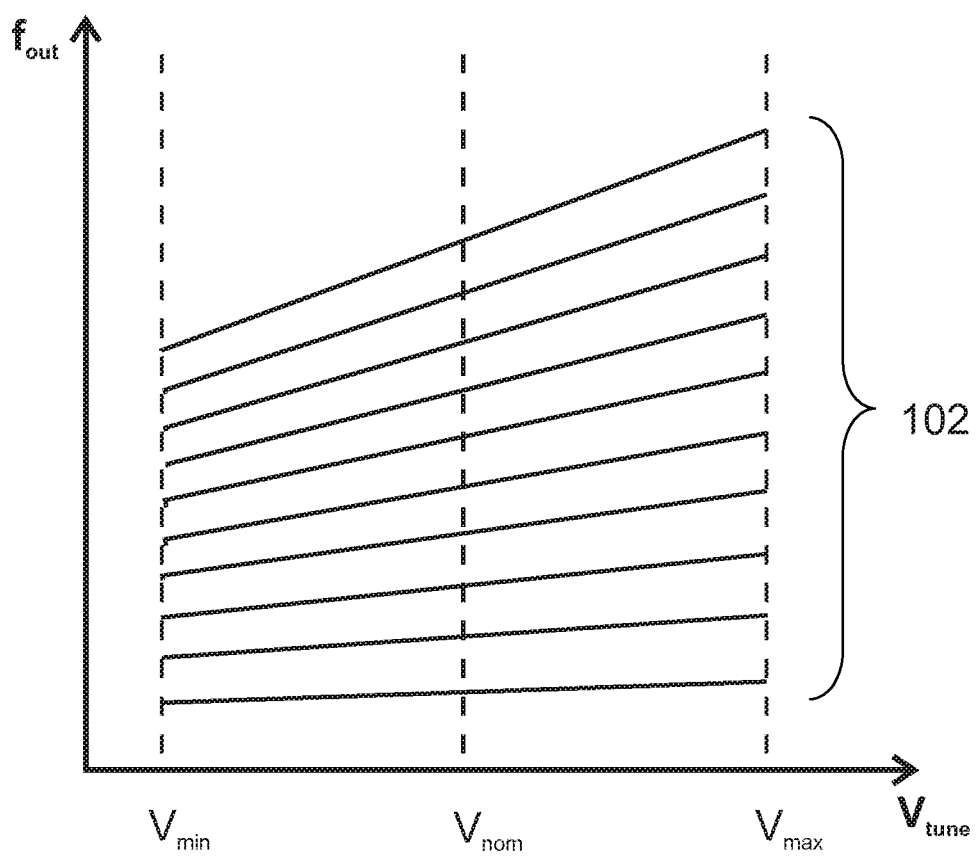
FIG. 1 shows a schematic diagram of an example of VCO frequency bands for different tuning voltages and frequency band settings.
Figure 2:
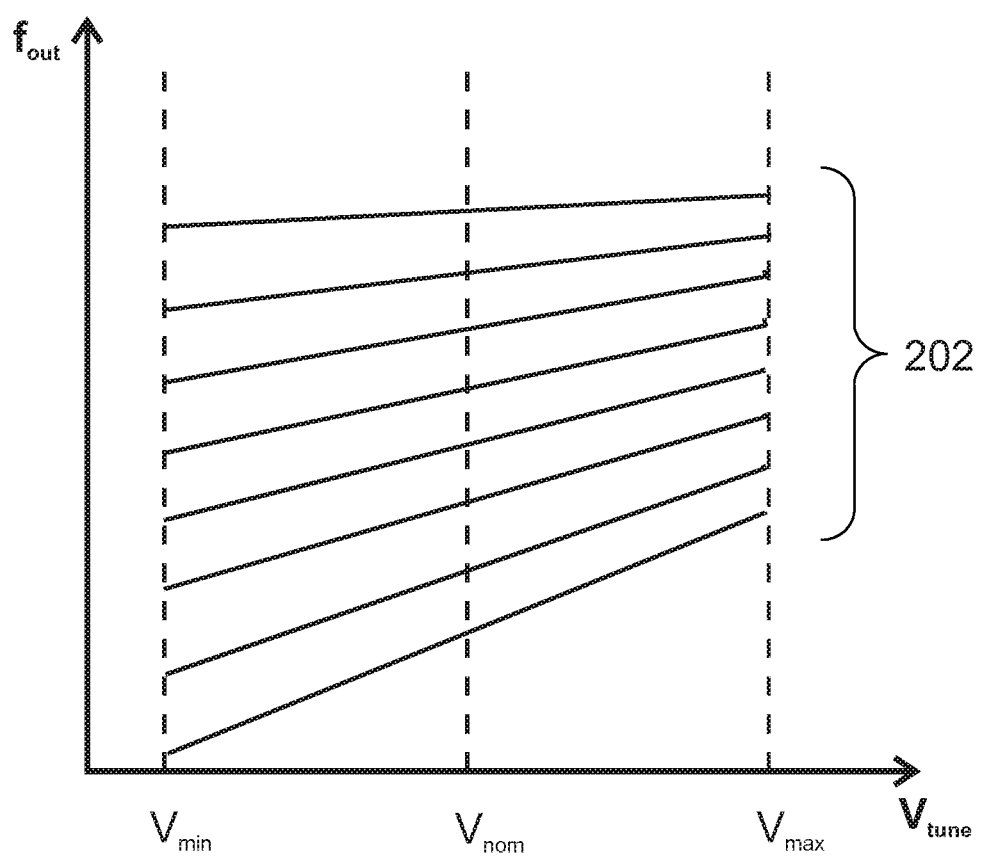
FIG. 2 shows a schematic diagram illustrating an example of VCO gain variation in one frequency band, where the VCO gain is controllable in 8 discrete steps.

Referring to FIG. 1 and FIG. 2, the VCO frequency range is split into multiple sub-bands (frequency bands) by setting different frequency band settings 102, and the VCO gain can be tuned according to a set of gain tuning settings 202. This allows to compensate for VCO gain variations, and therefore, if the multi-band VCO is used in a PLL system, the variation of the PLL loop bandwidth.

FIG. 1 shows a schematic diagram of a synthesized frequency $f_{out}$ plotted against a tuning voltage $V_{tune}$ of a VCO, showing different frequency bands for different frequency band settings 102, wherein the slope is the gain of a frequency band. In this diagram, $V_{tune}$ is shown around a nominal tuning voltage $N_{nom}$.

FIG. 2 shows a schematic diagram of a synthesized frequency $f_{out}$ plotted against a tuning voltage $V_{tune}$ of a VCO illustrating an example of a VCO gain variation in one frequency band, where the VCO gain is controllable in 8 discrete steps of VCO gain settings 202.

Since the VCO gain $KV_{CO}$ is given by $$K_{VCO} = \frac{d\omega}{dV_{tune}} = -\frac{\omega^3 L}{2}\frac{dC}{dV_{tune}} \qquad \text{(eq. 4)}$$

and therefore, $KV_{CO}/N$, the VCO gain at the PLL comparison frequency, which directly impacts the PLL bandwidth and stability, eq. 4 can be written as:

$$\frac{K_{VCO}}{N} = \frac{d\omega}{N \cdot dV_{tune}} = -\frac{\omega^3 L}{2N}\frac{dC}{dV_{tune}} = \frac{-\omega^2 \omega_{REF} L}{2} \cdot A_{UNT} \cdot \frac{dC}{dV_{tune}} \qquad \text{(eq. 5)}$$

with $\omega_{REF}$ the PLL reference (or comparison) frequency and $A_{UNT}$ the number of analog varactors with their control voltage set to the $V_{tune}$ VCO tuning voltage at the considered VCO synthesized frequency $\omega = 2\pi \cdot f_{out}$.

From equation 5 it can be extracted that if $A_{UNT}$ is made proportional to $1/\omega^2$, then $KV_{CO}/N$ will be strictly constant.

One way of implementing this behaviour is to control the number of "analog" varactors (cf. FIG. 6) in a manner that is as close as possible to the desired $1/\omega^2$ law, by switching ON/OFF banks of varactors connected to $V_{tune}$. However, switching ON/OFF an analog varactor also changes the synthesized VCO frequency $f_{out}$, even if the digital varactors (cf. FIG. 6) are not changed, because it will add or remove capacitance from the total.

The task of selecting the right frequency band setting 102 and gain setting 202, taking into account that the synthesized frequency $f_{out}$ changes according to the gain setting chosen, is then solved with an iterative process designed to select the best pair of digital frequency band number and VCO gain setting.

Figure 3:
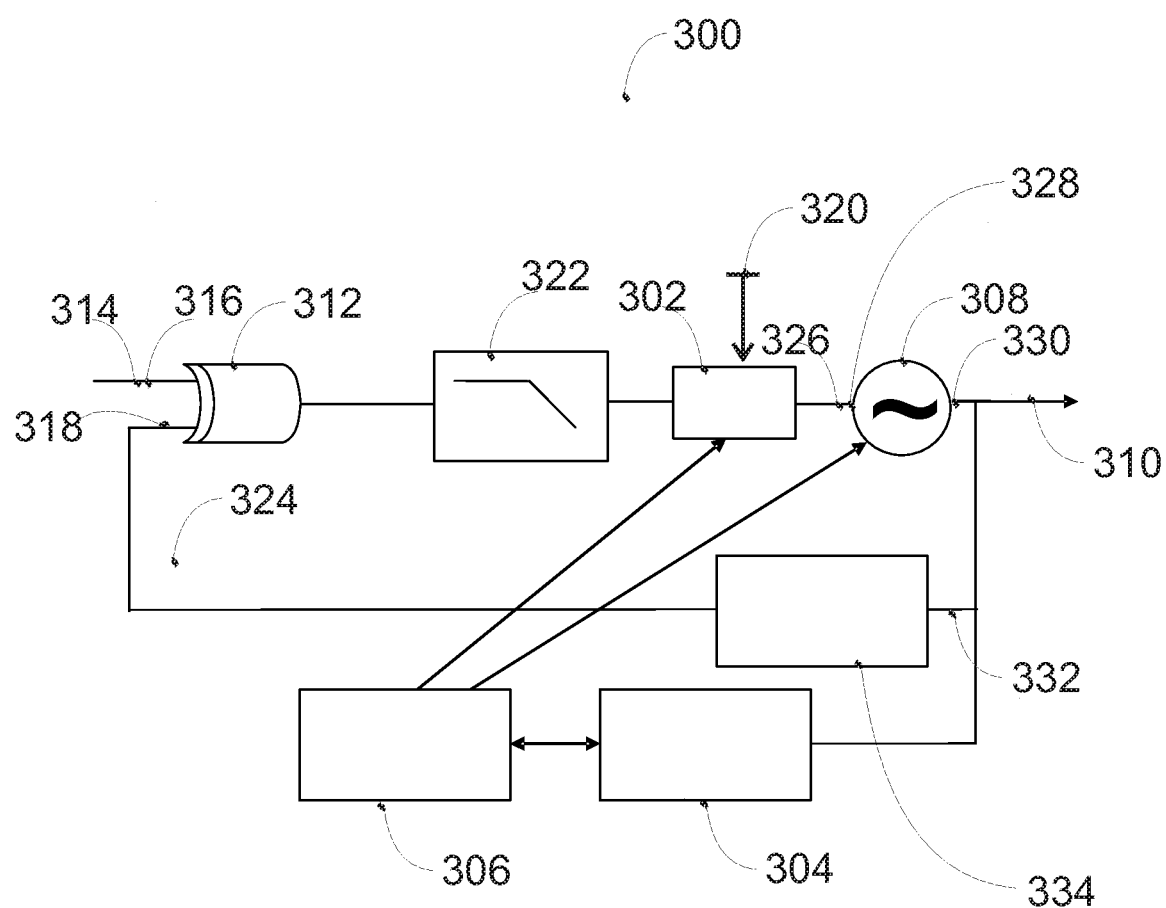
FIG. 3 shows a schematic block diagram of an example of an embodiment of an XOR PLL system with an added apparatus in accordance with the present invention.

Referring now to FIG. 3, the example of a phase locked loop (PLL) system 300 shown therein, comprises a voltage controlled oscillator (VCO) circuit 308. The VCO circuit 308 comprises a frequency tuning input 328, an output 330 providing a first clock signal with a synthesized frequency 310, and a first plurality of switchable varactors (cf. FIG. 6) for selecting a frequency band of the VCO 308. The VCO 308 has a gain that changes with frequency band, and comprises a second plurality of switchable varactors (cf. FIG. 6) for varying the VCO gain in the selected frequency band of the VCO 308. The PLL system 300 further comprises a PLL feedback circuit 324 having a first input 332 receiving the first clock signal with the synthesized frequency 310, a second input 316 receiving a second clock signal with a reference frequency 314, and an output providing a tuning voltage 326 to the frequency tuning input 328 of the VCO 308. Furthermore, the PLL system 300 comprises a switching device 302 for switching the PLL feedback circuit 324 to either an open loop state or a closed loop state, wherein in the open loop state a plurality of different predefined tuning voltages 320 can be applied to the frequency tuning input 328 of the VCO 308, a frequency measurement device 304 for measuring the synthesized frequency 310 of the first clock signal, and a control unit 306 operable to determine the VCO gain with respect to the synthesized frequency 310 and the predefined tuning voltages 320.

The PLL system 300 outputs the synthesized frequency 310, i.e. a local oscillator frequency generated by the voltage controlled oscillator (VCO) 308 having its tuning voltage ($V_{tune}$) 326 driven by the PLL feedback circuit 324. The XOR phase detector 312 fed by the reference frequency 314 and by a variable feedback frequency 318, which is the synthesized frequency 310 divided by a programmable divider (1/N) 334, provides the phase difference of those two inputs to a low pass loop filter 322 that provides the $V_{tune}$ tuning voltage 326 for the VCO 308.

The switching device 302 may open the PLL feedback loop 324, allowing to force the VCO tuning voltage 326 to each of a plurality of predefined tuning voltages 320. The values of the tuning voltages depend on the characteristics of the implemented VCO circuit 308 and may e.g. be between ground and the supply voltage of the VCO 308. This switching device 302 is controlled by the control unit 306 executing a digital algorithm selecting the mentioned settings. The switching device 302 can be of any type, operable to apply to the tuning input 328 of the VCO 308 different tuning voltages.

The frequency measurement device 304 may measure the synthesized frequency 310 of the VCO 308 and provide the control unit 306 with a measured synthesized frequency 310, e.g. by counting the number of periods of the synthesized frequency 310 during a fixed amount of time. The frequency measurement device 304 thus allows to determine the synthesized frequency 310 at the selected VCO frequency band.

The frequency measurement device 304 may e.g. be a ripple counter 304. However, other counters, such as synchronous counters or decade counters, just to give a few, may be used.

The control unit 306 is operable to control the switching device 302 and apply the plurality of predefined tuning voltages 320 to the frequency tuning input 328 of the VCO 308 for determining the VCO gain with respect to the synthesized frequency 310 and the predefined tuning voltages 320. This allows the control unit 306 to force the application of different predefined tuning voltages 320 to the tuning input 328 of the VCO 308 which serve as input parameters for measuring the gain of the VCO 308.

The control unit 306 may e.g. be operable to start and stop a measurement of said synthesized frequency 310. Thus, the control unit 306 can control the acquisition of the measured frequency values caused by the predefined input tuning voltages 320 applied through the switching device 302.

Figure 6:
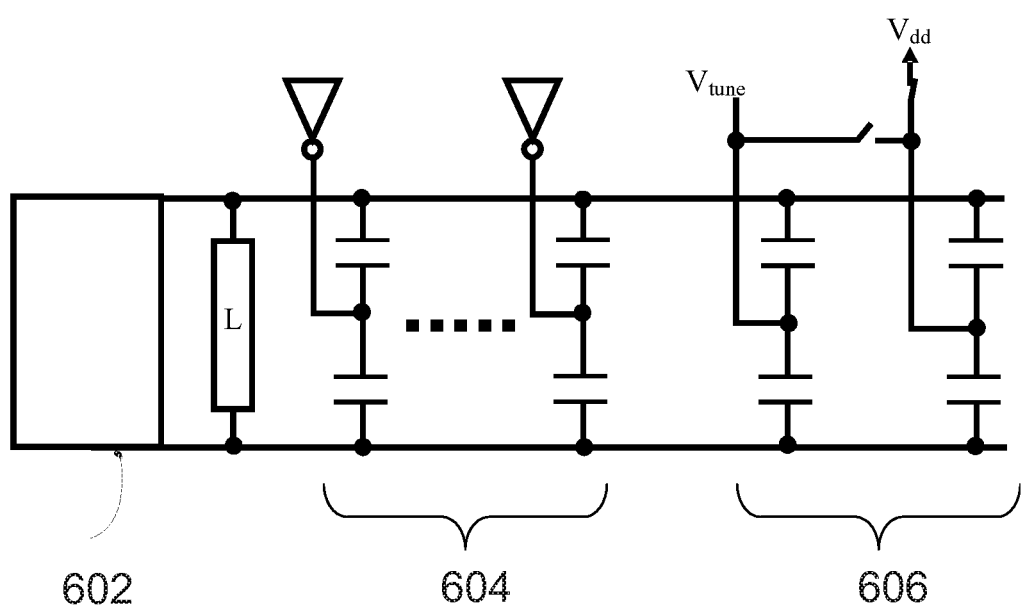
FIG. 6 shows a schematic diagram of an example of an embodiment of a VCO circuit comprising an oscillator core, digitally controlled varactors, and analog controlled varactors.

The control unit 306 may be operable to search for and select a frequency band of the VCO 308, e.g. by applying a first plurality 102 of sets of setting values to the first plurality of varactors (cf. FIG. 6), applying a second plurality 202 of sets of setting values to the second plurality of varactors (cf. FIG. 6) for the selected frequency band and measuring the VCO gain for the selected frequency band and the setting values 202 for the second plurality of varactors, and selecting a best VCO gain for the frequency band. This allows the control unit 306 to control the selection of a suitable frequency band, i.e. sub-band, for a desired output frequency and adjust the VCO gain in that selected frequency band. The pluralities of varactors are switchable (as shown in FIG. 6 below), and therefore the control unit can add or remove capacitance from the VCO circuit 308 and therefore change the synthesized frequency 310.

The control unit 306 may select the frequency band, if the VCO circuit 308 is set up to allow for multiple frequency bands and adjusts the gain of the VCO circuit 308 by executing a digital algorithm that controls the overall processing by selecting the VCO frequency band, the VCO gain, the VCO tuning voltage 326 (via the switch 302) and the starting of a cycle of the switching device 304. The algorithm may allow both tuning the VCO gain and selecting the right VCO frequency band for monotonic and non-monotonic frequency characteristics of the VCO(s) 308.

The control unit 306 may perform a further frequency band selection for the VCO 308 based on the selected VCO gain, since once a suitable VCO gain is selected, the synthesized output frequency 310 may slightly change due to the change of total capacitance.

In order to search for and to select a frequency band, the control unit 306 may apply a first predefined tuning voltage to the frequency tuning input 328 of the VCO 308, set the VCO gain to a minimum value, and perform an algorithm that selects the frequency band of the VCO 308.

The control unit 306 may apply at least two predefined tuning voltages 320 to the frequency tuning input 328 of the VCO 308 and apply the second plurality 202 of sets of setting values to the second plurality of varactors (cf. FIG. 6) for the selected frequency band and measure the synthesized frequency 310 for each of the at least two predefined tuning voltages 320. This enables the control unit to easily measure the resulting VCO gain for all available VCO gain tuning settings.

The control unit 306 may in addition to controlling the measuring, determine the VCO gains with respect to the measured synthesized frequencies 310 and the plurality of predefined tuning voltages 320, and select one of the VCO gains closest to a desired VCO gain as the selected VCO gain.

The control unit 306 may be set up to carry out the frequency band selection algorithm mentioned above. In an embodiment of the system, this algorithm comprises: comparing the synthesized frequency 310 divided by a number with the reference frequency 314 of the second clock signal, wherein the number times the reference frequency 314 equals a desired synthesized frequency; changing the frequency band either to a higher or to a lower band depending on the sign of a result of the comparison; and repeating the comparison and the frequency band change until an optimum for the result of the comparison is reached.

The gain tuning and the frequency band selection may apply a tuning voltage 326 to the input 328 of the VCO 308. For this, predefined voltages can be used. The plurality of predefined tuning voltages 320 may comprise a first predefined tuning voltage equal to a nominal tuning voltage minus a first predefined value, and a second predefined tuning voltage equal to the nominal tuning voltage plus a second predefined value. The nominal tuning voltage allows the VCO circuit to function at a suitable working point for all possible frequency bands. Selecting predefined tuning voltages around this nominal voltage therefore helps in acquiring reliable results and optimize the gain tuning for a relevant working range of the VCO circuit.

The first predefined value and the second predefined value may be for instance the same value. Thus, the predefined tuning voltages may have an equal distance to the nominal tuning voltage.

The plurality of predefined tuning voltages 320 may comprise a third predefined tuning voltage equal to a nominal tuning voltage. This allows, for example, to select the frequency band selection to be carried out at the nominal tuning voltage.

Figure 4:
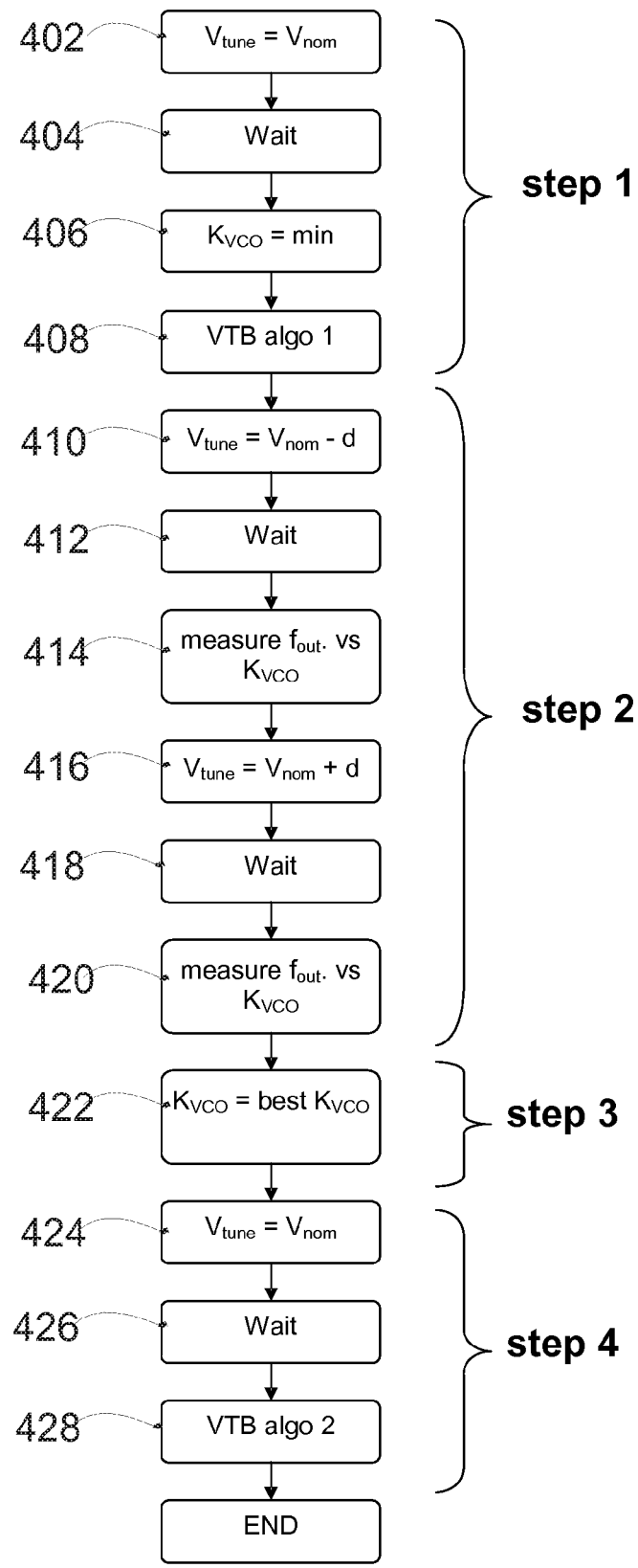
FIG. 4 schematically shows a flowchart illustrating an example of an embodiment of a VCO gain control method in accordance with the present invention.

Referring now to FIG. 4, a flowchart of an algorithm of an example of a VCO gain control method is provided. This flowchart illustrates an example of a gain control method combining a frequency band selection 1 and a gain tuning for the selected frequency band 2, 3, followed by another optimized frequency band selection 4. The method comprises searching for and selecting a frequency band of the VCO 308 circuit by applying a first plurality 102 of sets of setting values to a first plurality of varactors (cf. FIG. 6) of the VCO 308 circuit, applying a second plurality 202 of sets of setting values to a second plurality of varactors (cf. FIG. 6) of the VCO 308 circuit for the selected frequency band and measuring a VCO gain for the selected frequency band and the setting values 202 for the second plurality 606 of varactors, and selecting a best VCO gain for the frequency band.

Considering the gain tuning of a voltage controlled oscillator (VCO) circuit 308 in the phase locked loop (PLL) system 300 operable to output a clock signal with a synthesized frequency 310 and to receive at a frequency tuning input 328 a plurality of predefined tuning voltages 320, the method comprises switching the PLL system 300 to an open loop state, applying 410, 416 at least two voltages of the plurality of predefined tuning voltages 320 to the frequency tuning input 328, measuring 414, 420 a synthesized frequency 310 of an output clock signal of the VCO 308 for the applied at least two voltages, and determining 422 a gain of the VCO 308 with respect to the applied predefined tuning voltages and the synthesized frequencies 310. Since the gain tuning is presented embedded in the frequency band selection, the switching the PLL loop to an open loop state is not displayed.

As illustrated with 410 and 416, the method employs VCO tuning voltages from the plurality of predefined tuning voltages that comprises a first predefined tuning voltage equal to a nominal tuning voltage minus a first predefined value, and a second predefined tuning voltage equal to the nominal tuning voltage plus a second predefined value.

The first predefined value and the second predefined value may be the same value.

For combining frequency band selection and gain tuning, good results have been found when tuning the gain for the working point used for frequency band selection. Therefore, the plurality of predefined tuning voltages may comprise a third predefined tuning voltage equal to a nominal tuning voltage.

The example of FIG. 4 includes measuring the synthesized frequency. The synthesized frequency 310 may for example be measured by counting a number of periods of the synthesized frequency 310.

The example of FIG. 4 incorporates determining the gain of the VCO. The gain may for example be determined 422 by calculating a difference of values of the measured synthesized frequencies 310 divided by a difference of values of the applied tuning voltages corresponding to the measured synthesized frequencies 310. For example, a slope of the corresponding one of the $f_{out}$ vs. $V_{tune}$ plots, as illustrated in FIG. 2 may be calculated.

The gain control method may comprise the step of performing a further frequency band selection 428 for the VCO 308 based on the selected best VCO gain, as shown in FIG. 4. Thereby, deviation from the desired frequency may be counter acted. Applying setting values to the varactors as described above to set the best available VCO gain for a selected frequency band may, slightly, change the synthesized frequency 310 of the VCO circuit 308 again.

Searching for and selecting a frequency band of the VCO 308 by applying a first plurality 102 of sets of setting values to a first plurality of varactors, as indicated with step 1 in FIG. 4, may comprise applying one voltage of said plurality of predefined tuning voltages 320 to the frequency tuning input 328 of the VCO 308, setting said VCO gain to a minimum value and performing an algorithm that selects the frequency band of the VCO 308. The other frequency band selection, indicated with step 4 in FIG. 4 may be arranged in a similar manner.

The part of the gain tuning illustrated by step 2 mentioned above can be regarded as applying a second plurality 202 of sets of setting values to the second plurality of varactors (cf. FIG. 6) for the selected frequency band and measuring the VCO gain for the selected frequency band and the setting values for the second plurality of varactors. It may comprise applying at least two predefined tuning voltages to the frequency tuning input 328 of the VCO 308, and applying the second plurality 202 of sets of setting values to the second plurality 606 of varactors for the selected frequency band, and measuring the synthesized frequency 310.

The part of the gain tuning illustrated by step 3 can be regarded as selecting 422 a best VCO gain for the frequency band. It comprises the step of determining the VCO gains with respect to the synthesized frequencies 310 and the plurality of predefined tuning voltages 320 and selecting one of the VCO gains closest to a desired VCO gain as the best VCO gain.

Figure 5:
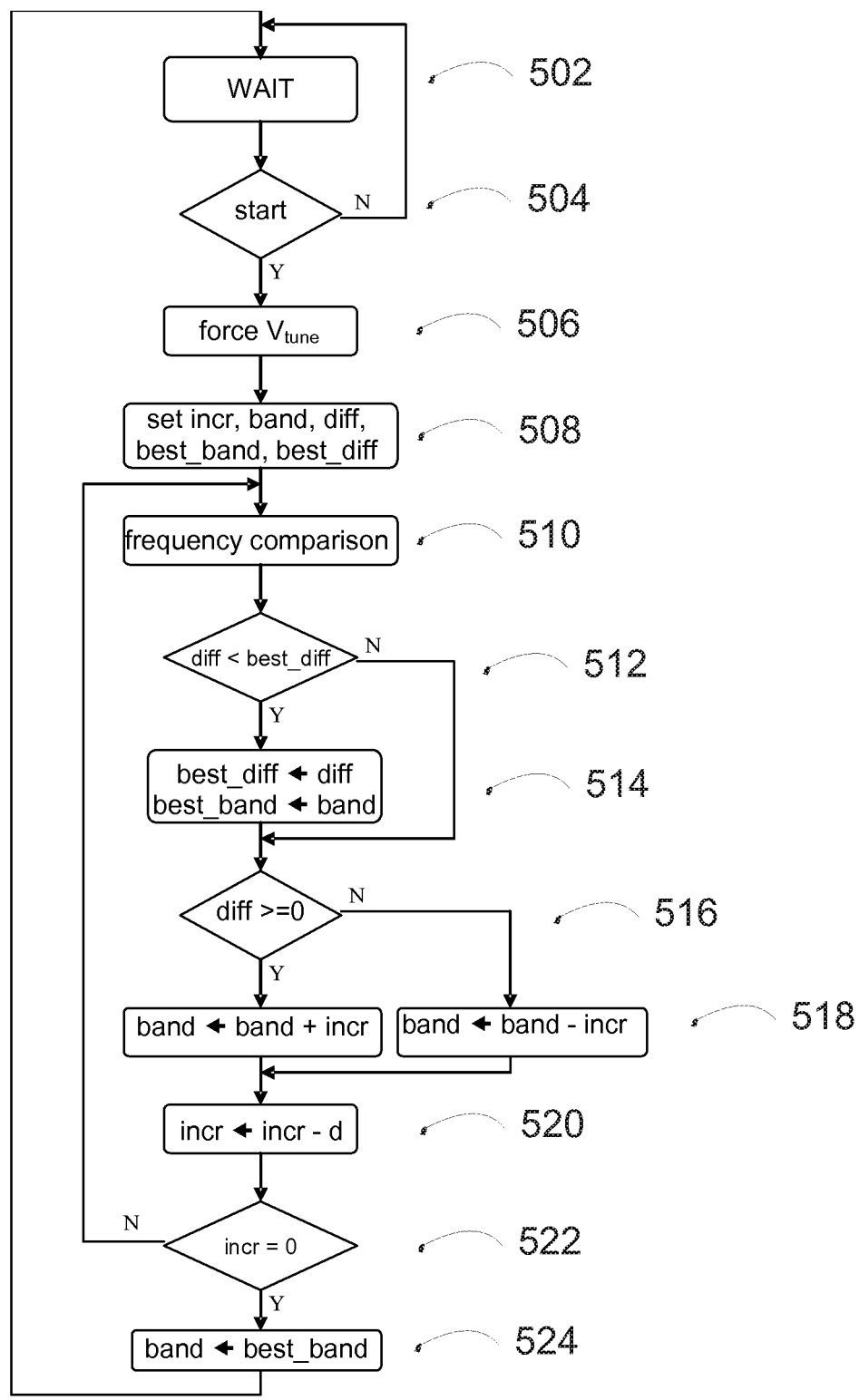
FIG. 5 schematically shows a flowchart illustrating an example of an embodiment of a frequency band selection algorithm for a VCO.

Summing up the gain control method described above, FIG. 4 consecutively illustrates an example as follows:

Firstly, the best sub-band is searched when the VCO control voltage, i.e. the tuning voltage of the VCO 326, is at its predefined nominal value 402 and when, after a short period of waiting for the setting to take effect 404, the VCO gain is set to its minimum value 406. Then a first VCO band selection algorithm 408 as shown in FIG. 5 is performed. Secondly, the $V_{tune}$ tuning voltage is set to the nominal voltage minus a fixed voltage shift 410, a short period of waiting for the setting to take effect 412, the number of periods of the synthesized frequency 414 is measured, with all the available VCO gain settings, the $V_{tune}$ tuning voltage is set to the nominal voltage plus the fixed voltage shift 416 and, after a short period of waiting for the setting to take effect 418, again the number of periods of the synthesized frequency 420, is measured with all the available VCO gain settings. Thirdly, the VCO gains 422 are calculated using the measured number of periods of the synthesized frequency as measured by the ripple counter, repeatedly at both tuning voltages specified above. The term best VCO gain setting as used herein is the one that gives the VCO gain closest to the desired one, as calculated previously to design a stable loop (cf. eq. 5). Fourthly, the VCO tuning voltage may be set to the predefined nominal tuning voltage again 424, followed by a short period of waiting for the setting to take effect 426, and, since changing the VCO gain slightly changes the synthesized frequency, a second VCO band-selection algorithm 428 is performed that finds the sub-band that gives the closest VCO synthesized frequency to the desired one. This is performed at the VCO gain selected in the step 3. Basically, during the third step, the VCO gain does not decrease, since the algorithm starts with the lowest gain setting available. Thus, the synthesized frequency only decreases when changing the VCO gain setting. This second VCO band selection algorithm specifically seeks for higher frequency bands and frequencies than the first VCO band selection algorithm in the first step.

Referring now to FIG. 5, the frequency band selection algorithm comprises comparing the synthesized frequency 310 divided by a number with a reference frequency 314 of a further clock signal, wherein the number times the reference frequency 314 equals a desired synthesized frequency, changing the frequency band either to a higher or to a lower band depending on the sign of a result of the comparison, and repeating the comparison and the frequency band change until an optimum for the result of the comparison is reached. It will be apparent that the optimum as used hereinrefers to a predetermined lower threshold for the difference. In FIG. 5 a flowchart illustrates an example of an embodiment of the frequency band selection algorithm for a VCO. Beginning in a state of waiting 502, after receiving a start signal 504, the $V_{tune}$ input voltage 326 is set 506 to a predefined nominal value, which can be the nominal tuning voltage in the first step of the gain tuning method described above. A set of registers, diff for the result of the frequency comparison, best_diff for a smaller value diff found during the flow, band for the current frequency band selected, best_band for the band providing the smallest diff, and incr for a variable for incrementing or decrementing the band selected for each iteration, is set to their initial condition 508. diff is set to maximum value, band and best_band are set to the middle band. Then a frequency comparison is executed 510, providing a diff according to a band. The frequency comparison is based on processing the difference between a reference frequency 314 and a divided synthesized frequency 318. This diff is compared to the value of best_diff 512. If diff is smaller than best_diff, the band selected is better and both best_band and best_diff are loaded to the current band and diff values 514, respectively. In order to find the best band, the value of the actual band is incremented or decremented according to the sign of diff 516, 518. Then, incr is halved 520 for a new iteration until unity. At the end 522 of this dichotomy algorithm, the value of the current band is set to the best band stored 524.

Referring now to FIG. 6, a schematic diagram of an example of an embodiment of a VCO circuit 308 comprising an oscillator core 602, digitally controlled varactors 604, and analog controlled varactors 606 is provided. In the provided diagram a plurality of digitally controlled varactors 604 is set to select a frequency band, a plurality of analog varactors 606 is used for gain control of the VCO circuit 308, where as an example only one of the varactors is shown as operably connected to the tuning voltage $V_{tune}$ 326, whereas the other adds no gain.

The methods carried out by the apparatus and control unit can be implemented using a state machine, e.g. implemented in a programmable logic device, allowing to select the best VCO frequency band to synthesize the required frequency while accurately controlling the VCO gain in order to achieve both the target bandwidth and phase margin for the PLL.

The invented method may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Although the discussed VCO circuit only mentions a single VCO, it may contain a plurality of VCOs covering a wider frequency range.

The use of the term "varactor" as used herein, does not exclude any other capacitive devices to be used in combination or instead.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device. For example, the invented PLL system may be integrated in a single physical device or distributed over a variety of devices, the invented method may be implemented as a computer program or in a programmable logic device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A phase locked loop system, comprising:
    a voltage controlled oscillator circuit, comprising:
        a frequency tuning input;
        an output providing a first clock signal with a synthesized frequency;
        a first plurality of switchable varactors for selecting a frequency band of said VCO, wherein said VCO has a gain that changes with frequency band; and
        a second plurality of switchable varactors for varying said VCO gain in said selected frequency band of said VCO;
    a PLL feedback circuit comprising:
        a first input receiving said first clock signal with said synthesized frequency,
        a second input receiving a second clock signal with a reference frequency, and
        an output providing a tuning voltage to said frequency tuning input of said VCO;
    a switching device for switching said PLL feedback circuit to either an open loop state or a closed loop state, wherein in said open loop state a plurality of different predefined tuning voltages can be applied to said frequency tuning input of said VCO;
    a frequency measurement device for measuring said synthesized frequency of said first clock signal; and
    a control unit operable to determine said VCO gain with respect to said synthesized frequency and said predefined tuning voltages, wherein said control unit is operable to search for and select a frequency band of said VCO by applying a first plurality of sets of setting values to said first plurality of varactors, apply a second plurality of sets of setting values to said second plurality of varactors for said selected frequency band and measure said VCO gain for said selected frequency band and said setting values for said second plurality of varactors, and select a best VCO gain for said frequency band.

2. The PLL system as claimed in claim 1, wherein said control unit is operable to control said switching device and apply said plurality of predefined tuning voltages to said frequency tuning input of said VCO.

3. The PLL system as claimed in claim 1, wherein said control unit is operable to start and stop a measurement of said synthesized frequency.

4. The PLL system as claimed in claim 1, wherein said control unit is operable to perform a further frequency band selection for said VCO based on said selected best VCO gain.

5. The PLL system as claimed in claim 1, wherein said control unit is operable to apply a first predefined tuning voltage to said frequency tuning input of said VCO, set said VCO gain to a minimum value, and perform an algorithm that selects said frequency band of said VCO.

6. The PLL system as claimed in claim 1, wherein said control unit is operable to apply at least two predefined tuning voltages to said frequency tuning input of said VCO and apply said second plurality of sets of setting values to said second plurality of varactors for said selected frequency band and measure said synthesized frequency for each of the at least two predefined tuning voltages.

7. The PLL system as claimed in claim 1, wherein said control unit is operable to determine said VCO gains with respect to measured synthesized frequencies and said plurality of predefined tuning voltages and select one of said VCO gains closest to a desired VCO gain as said best VCO gain.

8. The PLL system as claimed in claim 5, wherein said frequency band selection algorithm comprises comparing said synthesized frequency divided by a number with said reference frequency of said second clock signal, wherein said number times said reference frequency equals a desired synthesized frequency, changing said frequency band either to a higher or to a lower band depending on the sign of a result of said comparison; and repeating said comparison and said frequency band change until an optimum for said result of said comparison is reached.

9. The PLL system as claimed in claim 1, wherein said plurality of predefined tuning voltages comprises
    a first predefined tuning voltage equal to a nominal tuning voltage minus a first predefined value, and
    a second predefined tuning voltage equal to said nominal tuning voltage plus a second predefined value.

10. The PLL system as claimed in claim 9, wherein said first predefined value and said second predefined value are the same value.

11. The PLL system as claimed in claim 9, wherein said plurality of predefined tuning voltages comprises a third predefined tuning voltage equal to a nominal tuning voltage.

12. A method for controlling a gain of a voltage controlled oscillator circuit in a phase locked loop system operable to output a clock signal with a synthesized frequency and to receive at a frequency tuning input a plurality of predefined tuning voltages, comprising:
    switching said PLL system to an open loop state;
    applying at least two voltages of said plurality of predefined tuning voltages to said frequency tuning input;
    measuring a synthesized frequency of an output clock signal of said VCO for said applied at least two voltages;
    determining a gain of said VCO with respect to said applied predefined tuning voltages and said synthesized frequencies;
    searching for and selecting a frequency band of said VCO circuit by applying a first plurality of sets of setting values to a first plurality of varactors of said VCO circuit;

applying a second plurality of sets of setting values to a second plurality of varactors of said VCO circuit for said selected frequency band and measuring a VCO gain for said selected frequency band and said setting values for said second plurality of varactors; and selecting a best VCO gain for said frequency band.

13. The method as claimed in claim 12, wherein said plurality of predefined tuning voltages comprises
a first predefined tuning voltage equal to a nominal tuning voltage minus a first predefined value, and
a second predefined tuning voltage equal to said nominal tuning voltage plus a second predefined value.

14. The method as claimed in claim 13, wherein said plurality of predefined tuning voltages comprises a third predefined tuning voltage equal to a nominal tuning voltage.

15. The method as claimed in claim 12, wherein said synthesized frequency is measured by counting a number of periods of said synthesized frequency.

16. The method as claimed in claim 12, wherein said gain is determined by calculating a difference of values of measured synthesized frequencies divided by a difference of values of said applied tuning voltages corresponding to measured synthesized frequencies.

17. The method as claimed in claim 12, further comprising the step of performing a further frequency band selection for said VCO based on said selected best VCO gain.

18. The method as claimed in claim 12, wherein the step of searching for and selecting a frequency band of said VCO by applying a first plurality of sets of setting values to a first plurality of varactors comprises the steps of:
applying one voltage of said plurality of predefined tuning voltages to said frequency tuning input of said VCO;
setting said VCO gain to a minimum value; and
performing an algorithm that selects said frequency band of said VCO.

19. The method as claimed in claim 12, wherein the step of applying a second plurality of sets of setting values to said second plurality of varactors for said selected frequency band and measuring said VCO gain for said selected frequency band and said setting values for said second plurality of varactors comprises the steps of:

applying at least two predefined tuning voltages to said frequency tuning input of said VCO, and applying said second plurality of sets of setting values to said second plurality of varactors for said selected frequency band, and measuring said synthesized frequency.

20. The method as claimed in claim 12, wherein the step of selecting a best VCO gain for said frequency band comprises the steps of:
determining said VCO gains with respect to said synthesized frequencies and said plurality of predefined tuning voltages; and
selecting one of said VCO gains closest to a desired VCO gain as said best VCO gain.

21. The method as claimed in claim 18, wherein said frequency band selection algorithm comprises the following steps:
comparing said synthesized frequency divided by a number with a reference frequency of a further clock signal, wherein said number times said reference frequency equals a desired synthesized frequency;
changing said frequency band either to a higher or to a lower band depending on the sign of a result of said comparison; and
repeating said comparison and said frequency band change until an optimum for said result of said comparison is reached.

22. The PLL system of claim 1, wherein each of the first plurality of varactors are digitally controlled varactors, and each of the second plurality of varactors are analog controlled varactors.

23. The PLL system of claim 1, wherein a number of varactors selected in second plurality of switchable varactors by the second plurality of sets of setting values being applied to the second plurality of switchable varactors is based on a number of varactors selected in the first plurality of switchable varactors by the first plurality of sets of setting values being applied to the first plurality of switchable varactors.

* * * * *